(12) United States Patent
Levin

(10) Patent No.: US 6,413,441 B1
(45) Date of Patent: Jul. 2, 2002

(54) MAGNETIC POLISHING FLUIDS

(75) Inventor: Ludmila Levin, Kiriat-Bialik (IL)

(73) Assignee: MPM Ltd., Haifa (IL)

( * ) Notice: Subject to any disclaimer, the term of this patent is extended or adjusted under 35 U.S.C. 154(b) by 0 days.

(21) Appl. No.: 09/563,917

(22) Filed: May 4, 2000

Related U.S. Application Data

(60) Provisional application No. 60/132,813, filed on May 6, 1999.

(51) Int. Cl.⁷ .................................................. C09G 1/02
(52) U.S. Cl. ........................ 252/62.52; 51/308; 51/309; 51/307; 451/36; 451/37; 451/35
(58) Field of Search .................. 252/62.52; 51/307, 51/308, 309; 451/36, 37, 35

(56) References Cited

U.S. PATENT DOCUMENTS

| | | | |
|---|---|---|---|
| 4,821,466 A | 4/1989 | Kato et al. ..................... 51/317 |
| 5,449,313 A | 9/1995 | Kordonsky et al. ........... 451/35 |
| 5,525,249 A | 6/1996 | Kordonsky et al. ....... 252/62.52 |
| 5,577,948 A | 11/1996 | Kordonsky et al. ............ 451/35 |
| 5,578,238 A * | 11/1996 | Weiss et al. .............. 252/62.52 |
| 5,616,066 A | 4/1997 | Jacobs et al. .................. 451/36 |
| 5,795,212 A | 8/1998 | Jacobs et al. .................. 451/36 |
| 5,804,095 A | 9/1998 | Jacobs et al. ............. 252/62.52 |
| 5,839,944 A | 11/1998 | Jacobs et al. ................... 451/8 |
| 6,227,942 B1 * | 5/2001 | Hoffman ...................... 451/36 |

OTHER PUBLICATIONS

Rene Massart, "Preparation of Aqueous Magnetic Liquids in Alkaline and Acidic Media," *IEEE Transactions of Magnetics*, vol. Mag. 17, No. 2, Mar. 1981.

* cited by examiner

*Primary Examiner*—C. Melissa Koslow

(57) ABSTRACT

Magnetic polishing fluid compositions comprising various size colloidal and/or non-colloidal magnetic particle and colloidal size polishing particle compositions suitable for polishing ceramic and glass substrates are described. The compositions are usually aqueous compositions having highly basic pHs. Methods for preparing the various polishing fluids compositions are also discussed.

70 Claims, No Drawings

MAGNETIC POLISHING FLUIDS

This application is related to provisional application No. 60/132,813, filed May 6, 1999, which is incorporated in its entirety by reference herein.

FIELD OF THE INVENTION

The present invention relates to magnetic polishing fluids for polishing ceramic or optical materials.

BACKGROUND OF THE INVENTION

Chemical-mechanical polishing is a commonly used technique for planarization of bare silicon, silica and other ceramic wafers. In chemical-mechanical polishing, the wafers are held against a rotating polishing pad wetted by a slurry consisting of colloidal abrasive particles (silicon dioxide, alumina, cerium oxide, etc.) and specific additives to enhance the rate and quality of polishing. When silica is used, a high pH is required. An oxide or hydroxide surface layer forms on the wafer and the reaction products are removed by mechanical action of the pad and the colloidal silica slurry. Similar processes occur when other abrasives are used.

The bending and stresses of the rotating polishing pad strongly influence the quality of planarization. The adverse effects of a solid polishing pad can be avoided, or at least mitigated, by using a magnetic polishing fluid which forms a plasticized mass in an a inhomogeneous magnetic field.

Magnetorheological fluids (MRFs) for polishing are known in the art. With MRFs, the polishing pad common to conventional polishing is dispensed with entirely.

The viscosity of magnetorheological fluids increases in a magnetic field and the fluids, which contain magnetic particles, acquire the characteristics of a plasticized solid, forming an abrasive mass with a viscosity and elasticity suitable for polishing.

Kordonsky et.al., U.S. Pat. No. 5,449,313, describes a magnetorheological fluid which comprises a plurality of magnetic particles (carbonyl iron particles), abrasive particles (cerium oxide), a stabilizer (fumed silica), and a carrying fluid consisting of a mixture of water and glycerin.

Kordonsky et.al., U.S. Pat. No. 5,525,249, describes a magnetorheological fluid comprising magnetosolid and magnetosoft particles, a stabilizer (fumed silica), and a carrying fluid comprising an aromatic alcohol, vinyl ester, and an organic solvent or diluent carrier such as kerosene, Jacobs et al. U.S. Pat. No. 5,795,212 describes a magnetic fluid which uses iron particles together with $CeO_2$ particles, the latter serving as an abrasive polishing agent.

Jacobs et al,. U.S. Pat. No. 5,804,095, describes a magnetorheological polishing fluid which comprises among other components magnetic particles, a $CeO_2$ abrasive polishing agent, and $Na_2CO_3$.

Kato et al. 4,91,466 recites the use of a magnetic fluid comprising colloidal iron particles and abrasive particles with a size of about 40 $\mu$m.

Polishing machines used with prior art MRF compositions cause the MRFs to acquire viscous, plasticized properties known as Bingham properties, when the fluids are subject to the influence of magnetic forces. When in a magnetic field, the MRF is hard enough to be used as a polishing tool. However, these polishing fluids reach their fully developed Bingham state only at the outset of the polishing process. Once the substrate being polished begins to move relative to the MRF, the shear stress of the abrasion process causes the MRF to lose its Bingham properties and its plasticized characteristics. The MRF remains viscous throughout the process but returns to a liquid, non-plasticized state almost immediately after abrasion begins, thereby reducing polishing efficiency.

The magnetorheological fluids in the above-cited compositions usually do not provide a chemical mechanism for enhancing the efficiency of the polishing process. In addition, these fluids generally contain magnetic and/or abrasive particles with sizes in excess of 1 $\mu$m. These large size particles, and especially their agglomerates, introduce defects, scratches and non-uniformities onto the surface being treated.

Finally, because of the large size magnetic or abrasive particles used, these fluids have a tendency to settle due to gravitational forces. Because of their size, the abrasive particles act as agglomeration centers, contributing to the aggregation of magnetic particles and to the instability of the magnetic fluid. Any use of such fluids requires prior agitation.

SUMMARY OF THE INVENTION

The present invention discusses magnetic polishing fluid compositions and their methods of preparation. These compositions can be used to polish many different types of materials employed in the semiconductor, optical and microelectronic industries.

The present invention teaches various magnetic polishing fluid compositions. One embodiment of such a composition includes colloidal size magnetic particles where the mean particle size ranges from about 0.01 $\mu$m to about 0.15 $\mu$m, colloidal size polishing particles where the mean particle so ranges from about 0.01 $\mu$m to about 0.1 $\mu$m, at least one stabilizer and a carrying fluid where the pH of said composition is greater than 9 to about 12.

Another magnetic polishing fluid composition embodiment comprises colloidal and non-colloidal magnetic particles where the non-colloidal magnetic particles have a mean particle size ranging from about 0.15 $\mu$m to about 3.0 $\mu$m and the colloidal magnetic particles have a mean particle size from about 0.01 $\mu$m to about 0.15 $\mu$m. The embodiment includes colloidal size polishing particles which have a mean particle size ranging from about 0.01 $\mu$m to about 0.1 $\mu$m and at least one stabilizer for stabilizing the colloidal size particles. Finally, the composition contains an additive for adjusting viscosity, and a fluid wherein the pH of said composition is greater than 9 to about 12.

A third magnetic polishing fluid embodiment comprises magnetic particles with a mean particle size ranging from about 0.15 $\mu$m to about 3.0 $\mu$m, colloidal size polishing particles with a mean particle size ranging from about 0.01 $\mu$m to about 0.1 $\mu$m, at least one stabilizer for stabilizing the colloidal particles, an additive for adjusting viscosity, and a carrying fluid where the pH of said composition is greater tan 9 to about 12.

The invention teaches a method for preparing a composition comprising the steps of preparing a colloidal size magnetic particle dispersion with a stabilizer in a carrying fluid, preparing a colloidal size polishing particles dispersion in a carrying fluid, mixing said colloidal size magnetic particle dispersion and said colloidal size polishing particle dispersion to form a mixture, and adjusting the pH of said mixture to greater than 9 to about 12, if the mixture is not already at that pH.

Another method for preparing certain compositions of the invention includes the steps of preparing a non-colloidal size magnetic particle dispersion by adding the particles to a mixture of a viscosity additive in a carrying fluid, preparing a colloidal size magnetic particle dispersion with a stabilizer in a carrying fluid, preparing a colloidal size polishing particle dispersion in a carrying fluid, mixing the colloidal size magnetic particle dispersion and the colloidal size polishing particle dispersion to form an intermediate mixture, mixing the intermediate mixture with the non-colloidal size magnetic particle dispersion, and adjusting the pH of the composition to a pH in the range of from greater than 9 to about 12, if the final composition is not already at that pH.

The invention also teaches several specific compositions one of which includes colloidal size magnetic particles comprised of colloidal size magnetite ($Fe_3O_4$) particles having a weight percent content ranging from about 20 to about 55 wt % of the final composition, colloidal size polishing particles comprised of colloidal size silica ($SiO_2$) particles having a weight percent content ranging from about 1 to about 20 wt % of the composition, at least one stabilizer comprised of tetramethylammonium hydroxide having a weight percent content ranging from about 0.05 to about 25 wt. % of the composition and a carrying fluid, adjusted to a pH greater than 9 to about 12, comprising any remaining wt % of said composition. The carrying fluid comprises the remaining wt % of the composition.

Another composition taught includes non-colloidal size magnetic particles selected from carbonyl iron or magnetic particles, the particles having a weight percent content from about 21 to about 38.5 wt %. The composition also includes colloidal size magnetic particles comprising colloidal size magnetite particles having a weight percent content form about 3 to about 7.5 wt % and colloidal size polishing particles comprised of colloidal size silica particles having a weight percent content from about 1 to about 10 wt %. It also includes a stabilizer, tetramethylammonium hydroxide having a weight percent content from about 0.5 to about 10 wt. % and a viscosity adjusting additive comprising polyethylene glycol having a weight percent content from about 0.1 to about 5 wt. %. Finally, the composition is completed with a carrying fluid adjusted to a pH greater than 9 to about 12. The carrying fluid comprises the remaining wt % of the composition.

A third composition taught by the present invention includes magnetic particles which are carbonyl iron particles. These iron particles have a weight percent content in the composition from about 20 to about 55 wt. %. The composition also includes colloidal size polishing particles comprised of colloidal size silica particles having a weight percent content in the composition from about 1 to about 20 wt. % and at least one stabilizer comprised of tetramethylammonium hydroxide having a weight percent content in the final composition ranging from about 0.5 to about 25 wt. %. The composition also contains an additive for adjusting viscosity, specifically polyethylene glycol, which has a weight percent content ranging from about 0.1 to about 10 wt. %. Finally, a carrying fluid, adjusted to a pH greater than 9 to about 12 comprises the remaining wt % of the composition. The carrying fluid comprises the remaining wt % of the composition.

DETAILED DESCRIPTION OF THE INVENTION

The present invention relates to the composition of various magnetic polishing fluids (MPFs) which can be used to polish different ceramic substrates, such as silica, alumina, cerium oxide, and glass. It is particularly advantageous as a composition for polishing silica ($SiO_2$). By varying the composition of these MPFs, the rate and quality of polishing can be controlled. The MPFs of the present invention polish at lower viscosities than the MRFs cited above, thereby also producing better quality surfaces. It is believed that the magnetic particle polishing process of this invention is abetted by chemical processes similar to those which occur in chemical-mechanical polishing.

A magnetic polishing fluid (MPF) in a magnetic field, although forming a plasticized mass when the field is activated, retains or reverts to the properties of a liquid during the polishing process. When in its plasticized state the mass possesses Bingham properties.

A magnetic polishing fluid comprised of magnetic particles, responds to a magnetic field gradient by increasing its viscosity and changing into a plasticized mass. Any polishing particles contained in the fluid are trapped in the plasticized mass and pushed out of the fluid in a direction perpendicular to the gradient.

This mass is an effective polishing tool when it comes into contact with a moving work surface. Upon contacting the polishing surface, and under the shear stress of the abrasion process, the plasticized mass reverts back to an almost liquid state.

In addition, when a polishing solution contains magnetic particles, particularly magnetic particles of non-colloidal size, the particles interact and form dendritic structures when plasticized under the influence of magnetic fields. These plasticized structures contain pores. A liquid media containing a polishing slurry comprising colloidal abrasive particles can fill the pores in the plasticized structure. The polishing rate is enhanced when the pores in the plasticized polishing mass are filled in this manner. The liquid containing the abrasive particles rises to the surface of the plasticized mass through capillary action. At the surface, the polishing particles are pressed by the polishing machine against the work surface.

The magnetic polishing fluid compositions of the present invention comprise, at a minimum, at least one type of magnetic particles, colloidal size abrasive particles, a stabilizer, and a carrying fluid. In one embodiment, the magnetic particles are of colloidal size and first dispersed in a stabilizer in a carrying fluid before mixing with colloidal abrasive particles. In another embodiment, two sizes of magnetic particles are used, one colloidal and one non-colloidal. Each size of magnetic particle is dispersed separately in its own carrying fluid before the two dispersions are mixed.

For purposes of the present invention, colloidal size magnetic particles are deemed to be particles with mean particle sizes of about 0.15 µm or less, while colloidal size polishing particles are deemed to be particles with mean particle sizes of about 0.1 µm or less. For purposes of the present invention, a ceramic is any non-biological material which has neither clearly defined metallic nor non-metallic characteristics and properties. It includes among other things classical ceramics, glasses and metalloids. Among other materials, it includes many oxides, nitrides, borides, and phosphides. Many of the materials used in the optical, microelectronic and semiconductor industries would be included in the definition of ceramics as used herein.

Certain embodiments of the invention may require a viscosity additive to control viscosity and/or a pH additive to adjust pH. Additives to increase the rate and enhance the quality of the polishing process can be added to the composition, as needed. In all the embodiments discussed, there is little agglomeration or sedimentation in the fluid over a period of one year at room temperature.

The magnetic particles used in these compositions can be chosen from many different ferrous and non-ferrous magnetic materials. These include, but are not limited to, ferromagnetic metals such as Fe, Ni, and Co, their alloys, ferrites, chromium oxides such as $CrO_2$, iron oxides such as $Fe_3O_4$, and cobalt oxides such as $Co_3O_4$, Carbonyl iron or magnetite ($Fe_3O_4$), particularly the latter, are the preferred sources for non-colloidal size magnetic particles. The preferred mean particle size range for non-colloidal magnetic particles is generally about 0.15–3.0 µm, and even more preferably 0.5–1.0 µm.

Capillary action is needed to transport the liquid containing the abrasive colloidal particles to the surface of the plasticized magnetic particle mass. The magnetic particles form quasi-columns with the pathways between them thought of as capillary tubes. The average diameter of the capillary is determined by magnetic particle size. The capillary must be narrow enough to generate a large capillary force but not too narrow to be clogged by abrasive particles. A rough calculation based on these principles, assuming abrasive particles with diameters of about 0.1 micron, can establish 3 microns as an approximate upper bound for the magnetic particles that should be used.

Colloidal magnetite ($Fe_3O_4$), the preparation of which is described below, is the preferred source of colloidal magnetic particles. The particles are formed from a mixed ferrous-ferric chloride solution to which either ammonium hydroxide, NaOH or urea is added. Methods for preparing colloidal magnetite other than the one disclosed herein below can also be used, such as the method of Massarat (IEEE Transactions of Magnetics, Vol. Mag 17 (#2) March 1981). Colloidal magnetic dispersions are also commercially available from manufacturers such as Ferrofluids, Inc. The preferred mean particle size range for colloidal magnetic particles is generally about 0.01–0.15 µm, preferably 0.03–0.05 µm.

Colloidal size polishing particles can be chosen from many types of oxides, such as α-$Fe_2O_3$, $ThO_2$, $ZrO_2$, $SnO_2$, $CeO_2$, $SiO_2$ or ZnO. Colloidal size particles of carbides e.g. SiC, nitrides e.g. $Si_3N_4$ and polycrystalline diamond can also be used as abrasives. The colloidal polishing particles, preferably silica ($SiO_2$), generally have a mean particle size range of about 0.01–0.1 µm. An even more preferred mean particle size range for the polishing particles is 0.03–0.05 µm. In the case of diamond, nanometer size particles can be used.

A stabilizing additive for the polishing agent can be chosen from many different non-ionic, anionic and cationic stabilizers, particularly from the group of alkylated ammonium hydroxides. In a preferred embodiment of the invention the stabilizing agent is tetramethylammonium hydroxide (TMAH), which also helps adjust pH. Surfactants that can be used as stabilizers are polydispersed nonylphenol, sodium polyethoxylate, sodium dodecylsulfonate, decylmethylsulfoxide and sodium lignosulfonates. The same stabilizer is usually, but not necessarily used to stabilize both colloidal size magnetic and colloidal size polishing particles. Use of low molecular weight stabilizers are preferred since high molecular weight stabilizers, and in particular polymeric surfactants, decrease the rate of polishing, sometimes by as much as a factor of four or five.

All of the magnetic polishing fluids require a carrying fluid. The preferred carrying fluid in all embodiments is water, and even more preferred is de-ionized water. Water is a preferred carrying fluid, particularly advantageous when organic residues are problematic as is often the case in the microelectronic industry.

Other carrying fluids can also be used. These include, but are not limited to, polar organic solvents, such as alcohols and ketones, and mixtures of water and polar organic solvents.

In some embodiments, especially those using non-colloidal magnetic particles, viscosity additives may be required. These can be chosen from water soluble polar polymeric materials, such as polyalcohols, having molecular weights (MW) of about 300,000 to about 1,000,000. A preferable viscosity additive is polyethylene glycol (PEG). A typical static viscosity for the MPFs of this invention, that is the viscosity of the composition when not being used for processing, is about 300–1200 cps.

KOH, NaOH, and tetramethylammonium hydroxide, preferably the latter, and acidic compounds such as acetic acid and other weak organic acids can be used to adjust pH. The pH of the magnetic fluids should be greater than 9 to about 12.

The exact pH of an MPF composition depends on its intended use. Polishing silica wafers, for example, requires a pH in the 10.5–11 range, while polishing different types of glasses requires pHs of 11.8–12.0.

The MPFs of the present invention can be prepared in several ways, the exact method of preparation depending on the composition of the fluid. A preferable method for preparing the MPFs of this invention is a multi-step process.

When non-colloidal size magnetic particles are used, a dispersion of such particles in a carrying fluid is prepared. The powder is usually dispersed in the presence of a viscosity additive, after the additive has been mixed into the carrying fluid. When the carrying fluid itself is a multi-component system, the carrying fluid is usually prepared from its components prior to adding the viscosity additive.

The method for preparing a colloidal magnetic particle dispersion is similar to that of the non-colloidal one discussed immediately above except that a stabilizer replaces the viscosity additive. The colloidal magnetic powder can be purchased or synthesized. When the colloidal powder is synthesized, the stabilizing agent is usually added directly to the powder immediately after synthesis. Colloidal size iron particles can be synthesized as described in Example II below or by other methods described in the literature.

A dispersion of stabilized colloidal size polishing particles in a carrying fluid is then prepared. The stabilized colloidal dispersion can be prepared by any known method. For example, if $SiO_2$ is used as the polishing agent, a colloidal dispersion can be prepared by dialysis, reaction of sodium silicate with acid, or ion exchange. Commercially available colloidal polishing particle dispersions can also be used.

After the colloidal polishing particle dispersion and either the non-colloidal magnetic particle or the colloidal magnetic particle dispersion have been prepared, the magnetic particle dispersion and the polishing dispersion are gradually mixed together while stirring vigorously. The pH of the final mixture is then adjusted to a value greater than 9 to about 12.

The magnetic particle, polishing particle and stabilizer contents in the final MPF composition range from about 20 to about 55 weight percent (wt. %), from about 1 to about 20 wt. %, and from about 0.5 to about 25 wt. %, preferably from about 25 to about 35 wt %, from about 3 to about 15 wt. %, and from about 1 to about 8 wt. %, respectively. When a viscosity additive is required, it is present in the final MPF composition in a wt % varying from about 0.1 to about 10 wt %, preferably from about 1 to about 5 wt %. Generally, the larger the weight percent of stabilizers used, the slower the rate of polishing. It is to be understood that when the weight percent ranges shown above and elsewhere in this specification do not total 100%, the remainder is made up of carrying fluid, adjusted to the proper pH as described above.

A multi-phase magnetic polishing fluid can be prepared as follows. Separate dispersions of non-colloidal magnetic particles, colloidal magnetic particles and colloidal polishing particles are prepared as described above. After the three dispersions have been prepared, the stabilized colloidal polishing particle dispersion is slowly added to, and mixed vigorously with, the stabilized colloidal magnetic particle dispersion to form an intermediate dispersion. The intermediate dispersion is gradually mixed with the non-colloidal magnetic particle dispersion, while stirring vigorously. The pH of the final product is then adjusted to a pH greater than 9 to about 12.

The proportions of non-colloidal magnetic, colloidal magnetic and colloidal polishing particles in the final MPF composition range between 21–38.5, 3–7.5 and 1–10 wt %, preferably 25–28, 3.75–5.25 and 3–5 wt %, respectively. The proportions of the stabilizer and viscosity additive range between about 0.5 to about 10 wt. % and about 0.1 to about 5 wt. %, preferably from about 0.5 to about 5 wt % and from about 1 to about 5 wt. %, respectively. Generally, the ratio of non-colloidal to colloidal magnetic particles should be from about 4.9:1 to about 6.1:1, preferably from about 5.3:1 to about 5.7:1.

In the multi-phase embodiment, a method of preparation was described wherein the colloidal polishing particle dispersion is first mixed with a colloidal magnetic particle dispersion. The resulting intermediate dispersion is then further mixed with the non-colloidal magnetic particle dispersion. An alternate, but equally acceptable, procedure would be to first mix the abrasive and non-colloidal magnetic dispersions to form an intermediate dispersion which in turn would be mixed with the colloidal magnetic dispersion.

The above MPFs can contain optional additives for increasing the rate and enhancing the quality of the polishing process. Examples of such additives are ammonium molybdate and zirconium sulfate, where the former serves as a chelating agent for abraded $Si(OH)_4$ while the latter serves to increase the polishing rate. Small amounts of cerium hydroxide are often added to improve polishing quality. Zinc salts are optional additives that act as a precipitant for removing attrited silica. The above additives are added in amounts usually ranging from about 0.5 to about 4.5 wt. %, depending on the additive being used and the substrate being polished. These additives are generally added to the colloidal polishing particle dispersion immediately after it is prepared.

The polishing fluids of the present invention can be used with most of the magnetic polishing machines discussed in the literature. Typical magnetic polishing machines are described in U.S. Pat. Nos. 4,821,466, 5,449,313, 5,577,948, 5,616,066, and 5,839,944. In addition, the compositions of the present invention were tested using a polishing machine that employs a series of intermittent impacts from a plasticized quasi-solid MPF.

The polishing fluids of the present invention can be used to polish ceramic wafers for the microelectronics industry, optical materials, superconductor lamina, ceramic aircraft bearings, and materials for microelectromechanical systems (MEMS).

The following are several magnetic polishing fluid compositions prepared using the procedures described above.

EXAMPLE I

A dispersion of magnetic particles in a carrying fluid was prepared by mixing 35 g of carbonyl iron (Sigma, particle size 3 μm) and 65 g of a 30% solution of polyethylene glycol (molecular weight 20000) in de-ionized (DI) water. The PEG/water mixture was prepared before the carbonyl iron was added. 10 g of a 50 wt. % colloidal silica dispersion (Nalco Ltd., particle size 0.02–0.05 μm) was gradually added to 90 g of the magnetic particle dispersion. The content of the magnetic and colloidal $SiO_2$ particles in the final product was 31.5 and 5 wt %, respectively.

EXAMPLE II

Colloidal magnetite ($Fe_3O_4$) was synthesized according to the following procedure. Aqueous solutions of Fe (III) chloride and Fe (II) chloride, each 10 wt % in their respective iron chloride, were mixed. The final molar ratio in the mixture was 2:1 $FeCl_3$:$FeCl_2$. A 25% aqueous solution of $NH_4OH$ was added to the mixture so that the molar ratio of Fe (II)/$NH_3$ was 19:1 in the mixture.

The solution was carefully stirred to hydrolyze the iron salts, forming a colloidal magnetite ($Fe_3O_4$) dispersion (particle size 0.01–0.02 μm). A stabilizing agent, tetramethylammonium hydroxide, in an amount of 10 wt % with respect to the magnetic powder was added to the colloidal magnetite dispersion immediately after the $Fe_3O_4$ was formed. The stabilized dispersion was concentrated by vacuum filtration to a magnetite content of 29 wt. %.

A colloidal silica dispersion containing 50 wt. % $SiO_2$, (Nalco Ltd., particle size 0.02–0.05 μm) was gradually added to the colloidal magnetic dispersion with vigorous stirring. The amount of colloidal silica added produced a final product with a $SiO_2$ content of 5 wt. %. The final product was a fluid comprising 26 wt. % of colloidal magnetic powder and 12.6 wt % tetramethylammonium hydroxide and had a pH of 10.

The magnetic polishing fluid that was obtained exhibited a magnetization saturation of 550 Gs and a viscosity of 500 cps.

EXAMPLE III

A carrying fluid for the dispersion of non-colloidal magnetic particles was prepared by dissolving 30 g of polyethylene glycol (molecular weight 20000) in 70 g of de-ionized (DI) water. A dispersion of non-colloidal magnetic particles was prepared by mixing 90 g of non-colloidal magnetite ($Fe_3O_4$) powder (Aldrich, particle size 5 μm), with 10 g of the polyethylene glycol/water solution. To produce a finer particle, the dispersion was triturated for one hour with an Attritor model 01-HDDM. The powder produced had a particle size of less than 1 μm but greater than 0.5 μm.

Colloidal magnetic particles of magnetite ($Fe_3O_4$) were synthesized using the method described in Example II. A dispersion of the stabilized colloidal magnetic particles was prepared also as described in Example II. The dispersion containing the stabilizer was concentrated by vacuum filtration to a magnetite content of 37 wt. %.

16.32 g of a 50 wt. % colloidal silica dispersion (Nalco Ltd., particle size 0.02 μm), was gradually added to 44.88 g of the colloidal magnetic particle dispersion while stirring vigorously. The content of the colloidal magnetic particles and the colloidal $SiO_2$ particles in the dispersion mixture was 8.6% and 13.8 wt. %, respectively. The product obtained had a pH of 10.0.

38.8 g of the non-colloidal magnetic particle dispersion were gradually mixed with 61.2 g of the dispersion containing the colloidal $Fe_3O_4$ and $SiO_2$ particles. Mixing was accompanied by continuous vigorous stirring. The content of the non-colloidal magnetic particles, colloidal magnetic particles and colloidal silica particles in the final product was 35.0, 5.0, 8.5 wt. %, respectively.

EXAMPLE IV

A dispersion of colloidal magnetic particles was prepared as in Example III and concentrated by vacuum filtration to a magnetite content of 30%.

23 g of a 50 wt. % colloidal $SiO_2$ dispersion (Nalco Ltd., particle size 0.02 μm), was added gradually to 50 g of the colloidal magnetic particle dispersion prepared previously. The two dispersions were mixed while stirring vigorously. In the mixture, the colloidal magnetic particles and colloidal polishing particles had particle contents of 30 and 5 wt. % respectively. Using KOH, the mixed dispersion was adjusted to a pH of 10.4. When 0.6 wt. % of zirconium sulfate was added to the dispersion, its $SiO_2$ wafer polishing rate increased from 450 Å/min to 1200 Å/min without adversely affecting roughness.

EXAMPLE V

A carrying fluid for the dispersion of non-colloidal magnetic particles was prepared by dissolving 1 g of polyethylene glycol (molecular weight 20000) in 99 g of de-ionized water. A dispersion of non-colloidal magnetic particles was prepared by mixing 90 g of non-colloidal magnetite ($Fe_3O_4$) powder (Aldrich, particle size 3 μm), with 10 g of the polyethylene glycol solution. To produce a finer particle, the dispersion was triturated for one hour with an Attritor model 01-HDDM. The powder produced had a particle size of less than 1 μm but greater than 0.5 μm.

Colloidal magnetic particles of magnetite ($Fe_3O_4$) were synthesized using the method described in Example II. A dispersion of the stabilized colloidal magnetic particles was prepared also as described in Example II. The stabilizer used with the colloidal magnetic particles was sodium lignosulfonate and the dispersion was 10 wt. % in magnetic powder. The sodium lignosulfonate was added to the colloidal particles immediately after their formation. The stabilized colloidal magnetic dispersion was concentrated by vacuum filtration to a magnetite content of 37 wt. %.

50 g of a 50 wt. % colloidal silica dispersion (Nalco Ltd., particle size 0.02 μm), was gradually added to 50 g of the colloidal magnetic particle dispersion while stirring vigorously. The content of the colloidal magnetic particles and the colloidal $SiO_2$ particles in the dispersion mixture was 17.8% and 25.0 wt. %, respectively. The product obtained had a pH of 10.0.

60 g of the non-colloidal magnetic particle dispersion were gradually mixed with 40 g of the dispersion containing the colloidal $Fe_3O_4$ and $SiO_2$ particles. Mixing was accompanied by continuous vigorous stirring. The content of the non-colloidal magnetic particles, colloidal magnetic particles and colloidal silica particles in the final product was 37.0, 5.1, 7.5 wt. %, respectively. The pH of the final polishing composition was 10 after being adjusted with a 50 wt % KOH solution.

Table I below shows the polishing results obtained when several of the examples prepared above were used as polishing fluids.

TABLE I

| Example No. | Polished Material | Removal Rate, Å/min | Average Roughness, Å | Within Wafer Non-Uniformity (WIWNU), % |
|---|---|---|---|---|
| I | PECVD TEOS $SiO_2$ | 3500 | 4.22 | — |
| II | PECVD TEOS $SiO_2$ | 700 | 0.99 | 0.2 |
| III | PECVD TEOS $SiO_2$ | 3000 | 1.63 | 0.5 |
| V | PECVD TEOS $SiO_2$ | 3500 | 3.68 | — |
| MRF | PECVD TEOS $SiO_2$ | 2500 | 7.38 | — |

PECVD TEOS $SiO_2$ is an acronym for plasma enhanced chemical vapor deposition, tetraethylorthosicate silica The sample indicated as MRF was prepared by a typical prior art method described in U.S. Pat. No. 5,577,948, column 9, Example 1.

The removal rate of the silicon wafers was measured using a Nanospec instrument located at the Israel Institute of Technology. Microelectronic Center, Haifa Israel. Surface roughness was measured using an atomic force microscope located at the Wolfson Applied Materials Research Center of Tel Aviv University.

The optimal ratio of non-colloidal to colloidal magnetic particles in multi-phase MPFs was experimentally determined. A series of PECVD TEOS silica wafers was polished using a multi-phase MPF with a constant 25 wt. % non-colloidal magnetic particle content. The colloidal particle wt % was different for each wafer.

TABLE II

| Non-colloidal: colloidal magnetic particle ratio | WIWNU, % | Removal rate, Å/min |
|---|---|---|
| 3 | 6.3 | 2882 |
| 4 | 6.0 | 2800 |
| 4.5 | 5.6 | 2790 |
| 5 | 2.8 | 2750 |
| 5.2 | 2.6 | 2740 |
| 5.5 | 2.4 | 2720 |
| 6 | 2.4 | 2680 |
| 6.1 | 2.4 | 2650 |
| 6.5 | 2.4 | 2200 |
| 7 | 2.5 | 1800 |
| 7.5 | 2.7 | 1600 |

Surprisingly, the results of the experiments show that while removal rate decreases monotonically with additional colloidal size magnetic particles, within wafer non-uniformity (WIWNU) does not. There appears to be a broad but definite minimum in the WIWNU figure of merit. The optimal range for the non-colloidal/colloidal particle ratio in a multi-phase system appears to be somewhere between about 4.9:1 and about 6.1:1, preferably between about 5.3:1 and about 5.7:1.

Experiments were carried out to determine the pH dependency on polishing quality using the MPFs of this invention. A PECVD TEOS silica wafer was polished using $SiO_2$ abrasives. The results in Table III show a rapid increase in removal rate at high pHs.

TABLE III

| pH | 2 | 4 | 6 | 8 | 10 | 11 | 12 |
|---|---|---|---|---|---|---|---|
| Removal rate, Å | 150 | 200 | 1000 | 1200 | 3720 | 3800 | 3690 |

Experiments were carried out to see the effect of abrasive particle size on polishing quality using the various magnetic particle embodiments of this invention. Conditions were kept constant for all three experiments, except as noted. The results are summarized in Table IV.

TABLE IV

| Abrasive Particle Size, microns | Surface Roughness, Å Non-colloidal Magnetic Particle MPF | Surface Roughness, Å Colloidal Magnetic Particle, MPF | Surface Roughness, Å Multi-phase Magnetic Particle MPF |
|---|---|---|---|
| 0.01 | 1.2 | 0.9 | 0.95 |
| 0.03 | 1.58 | 0.95 | 1.22 |
| 0.04 | 1.9 | 1.0 | 1.30 |
| 0.05 | 2.1 | 1.04 | 1.34 |
| 0.07 | 3.6 | 1.10 | 2.1 |
| 0.09 | 4.2 | 1.12 | 2.36 |
| 0.1 | 4.8 | 1.13 | 2.48 |
| 0.2 | 5.4 | 1.6 | 4.44 |
| 0.3 | 8.6 | 1.8 | 5.12 |
| 0.4 | 8.0 | 1.92 | 5.8 |
| 0.5 | 8.6 | 2.1 | 6.4 |
| 1.0 | 9.4 | 2.8 | 7.42 |

Magnetic polishing of ceramic surfaces using the MPFs of the present invention which contain colloidal magnetic particles provide a better quality polished surface than MPFs containing both non-colloidal and colloidal magnetic particles. However, the polishing rate of the former is slower, 50–100 nm/min. A colloidal MPF can be used for fine polishing, where surface roughnesses of <1 Å are required. The finer polishing can be carried out in the later stages of a multi-stage polishing process.

An MPF of the present invention that contains only non-colloidal magnetic particles provides faster polishing rates, e.g. 350 nm/min, than an MPF containing both colloidal and non-colloidal magnetic particles. The quality of the surface, however, will be inferior with a roughness of ~5 Å. An MPF containing both colloidal and non-colloidal particles can be used for relatively coarse polishing, particularly during the initial stages of a multi-stage polishing process.

While preferred embodiments of the present invention have been described so as to enable one of skill in the art to practice the present invention, the preceding description is intended to be exemplary only. It should not be used to limit the scope of the invention, which should be determined by reference to the following claims.

What is claimed is:

1. A magnetic polishing fluid composition comprising:
   colloidal size magnetic particles, wherein said magnetic particles have a mean particle size range from about 0.01 μm to about 0.15 μm;
   colloidal size polishing particles, wherein said polishing particles have a mean particle size range from about 0.01 μm to about 0.1 μm;
   at least one stabilizer for stabilizing said colloidal-size particles, wherein said stabilizer is an alkylated ammonium hydroxide; and
   a carrying fluid;
   wherein the pH of said composition is greater than 9 to about 12.

2. A composition according to claim 1 wherein said colloidal-size magnetic particles have a mean particle size range from about 0.03 μm to about 0.05 μm.

3. A composition according to claim 1 wherein said colloidal-size magnetic particles are selected from a group of materials consisting of ferromagnetic metals, their alloys, ferrites, carbonyl iron, cobalt oxides, chromium oxides and iron oxides.

4. A composition according to claim 1 wherein said colloidal-size magnetic particles are $Fe_3O_4$ particles.

5. A composition according to claim 1 wherein said colloidal-size polishing particles have a mean particle size range from about 0.03 μm to about 0.05 μm.

6. A composition according to claim 1 wherein said colloidal-size polishing particles are selected from a group consisting of $\alpha\text{-}Fe_2O_3$, $ThO_2$, $ZrO_2$, $SnO_2$, $SiO_2$, $ZnO$, polycrystalline diamond, SiC, and $Si_3N_4$.

7. A composition according to claim 1 wherein said colloidal-size polishing particles are $SiO_2$ particles.

8. A composition according to claim 1 wherein said carrying fluid is water.

9. A composition according to claim 1 wherein said stabilizer is tetramethylammonium hydroxide.

10. A composition according to claim 1 wherein said composition has a pH greater than 9 to about 12.

11. A composition according to claim 1 further comprising additives for the enhancement of the rate and quality of the polishing process wherein said additives are selected from the group consisting of zirconium sulfate, zinc salts, ammonium molybdate, and cerium hydroxide.

12. A composition according to claim 1, wherein:
   said colloidal-size magic particles comprise colloidal-size $Fe_3O_4$ particles having a weight percent content ranging from about 20 to about 55 wt % of said composition;
   said colloidal-size polishing particles, comprise colloidal-size $SiO_2$ particles having a weight percent content ranging from about 1 to about 20 wt. % of said composition;
   said at least one stabilize comprises tetramethylammonium hydroxide, said hydroxide having a weight percent content ranging from about 0.05 to about 25 wt. % of said composition; and
   said carrying fluid, adjusted to a pH greater than 9 to about 12, comprising any remaining weight percent of said composition.

13. A composition according to claim 1 wherein said colloidal-size magnetic particles, said colloidal-size polishing particles and said at least one stabilizer have weight percents of said composition ranging from about 20 to about 55 wt. %, from about 1 to about 20 wt. %, and from 0.05 to about 25 wt. %, respectively.

14. A composition according to claim 1 wherein said colloidal-size magnetic particles, said colloidal-size polishing particles and said at least one stabilizer have weight percents of said composition ranging from about 25 to about 35 wt %, from about 3 to about 15 wt. % and from about 1 to about 8 wt. %, respectively.

15. A method for preparing a composition according to claim 1, said method comprising the steps of:
   preparing a dispersion of colloidal-size magnetic particles with a stabilizer in a carrying fluid;
   preparing a dispersion of colloidal-size polishing particles in a carrying fluid; and mixing said colloidal-size magnetic particle dispersion and said colloidal-size polishing particle dispersion to form a mixture.

16. A method for preparing a composition according to claim 15, further comprising adjusting the pH of said mixture to greater than 9 to about 12.

17. A method according to claim 15 further comprising the step of mixing said carrying fluid with said stabilizer prior to the first preparing step.

18. A magnetic polishing fluid composition comprising:
colloidal and non-colloidal magnetic particles, wherein said non-colloidal magnetic particles have a mean particle size range from about 0.15 μm to about 3.0 μm and said colloidal magnetic particles have a mean particle size range from about 0.01 μm to about 0.15 μm;
colloidal-size polishing particles, wherein said polishing particles have a mean particle size range from about 0.01 μm to about 0.1 μm;
at least one stabilizer for stabilizing said colloidal-size particles;
an additive for adjusting viscosity, and
a carrying fluid;
wherein the pH of said composition is greater than 9 to about 12.

19. A composition according to claim 18 further comprising additives for the enhancement of the rate and quality of the polishing process wherein said additives are selected from the group consisting of zirconium sulfate, zinc salts, ammonium molybdate, and cerium hydroxide.

20. A composition according to claim 18 wherein said non-colloidal size magnetic particles have a mean particle size range from about 0.5 μm to about 1.0 μm.

21. A composition according to claim 18 wherein said colloidal-size magnetic particles have a mean particle size range from about 0.03 μm to about 0.05 μm.

22. A composition according to claim 18 wherein the ratio of said non-colloidal magnetic particles to said colloidal magnetic particles ranges from about 4.9:1 to about 6.1:1.

23. A composition according to claim 18 wherein the ratio of said non-colloidal magnetic particles to said colloidal magnetic particles ranges from about 5.3:1 to about 5.7:1.

24. A composition according to claim 18 wherein said colloidal size and non-colloidal size magnetic particles are selected from a group of materials consisting of ferromagnetic metals, their alloys, ferrites, carboxyl iron, cobalt oxides, chromium oxides and iron oxides.

25. A composition according to claim 18 wherein said non-colloidal size magnetic particles are selected from a group consisting of $Fe_3O_4$ and carbonyl iron particles.

26. A composition according to claim 18 wherein said colloidal-size magnetic particles are $Fe_3O_4$ particles.

27. A composition according to claim 18 wherein said colloidal-size polishing particles have a mean particle size range from about 0.03 μm to about 0.05 μm.

28. A composition according to claim 18 wherein said colloidal-size polishing particles are selected from a group consist of α-$Fe_2O_3$, $ThO_2$, $ZrO_2$, $SnO_2$, $SiO_2$, ZnO, polycrystalline diamond, SiC, and $Si_3N_4$.

29. A composition according to claim 18 wherein said colloidal-size polishing particles are $SiO_2$ particles.

30. A composition according to claim 18 wherein the carrying fluid is water.

31. A composition according to claim 18 wherein said viscosity adjusting additive is a polar polymeric material.

32. A composition according to claim 31 wherein said viscosity adjusting additive is a polyalcohol.

33. A composition according to claim 32 wherein said viscosity adjusting additive is polyethylene glycol.

34. A composition according to claim 18 wherein said stabilizer is selected from a group consisting of anionic, cationic and non-ionic surfactants.

35. A composition according to claim 18 wherein said stabilizer is an alkylated ammonium hydroxide.

36. A composition according to claim 35 wherein said stabilizer is tetramethylammonium hydroxide.

37. A composition according to claim 18 wherein said composition has a pH greater than 9 to about 12.

38. A magnetic polishing fluid composition according to claim 18 wherein:
said non-colloidal size magnetic particles is selected from a group consisting of carbonyl iron and magnetite particles, said particles having a weight percent content from about 21 to about 38.5 wt %;
said colloidal-size magnetic particles comprising colloidal-size magnetite particles, said particles having a weight percent content from about 3 to about 7.5 wt %;
said colloidal-size polishing particles comprising colloidal-size silica particles, said particles having a weight percent content from about 1 to about 10 wt. %;
said at least one stabilizer comprising tetramethylammonium hydroxide, said hydroxide having a weight percent content from about 0.5 to about 10 wt. %;
said viscosity adjusting additive comprising polyethylene glycol, said glycol having a weight percent content from about 0.1 to about 5 wt. %; and
said fluid adjusted to a pH greater than 9 to about 12, comprising any remaining wt % of said composition.

39. A composition according to claim 38 further comprising additives selected from among the group of ammonium molybdate, zirconium sulfite, cerium hydroxide and zinc salts in a weight percent ranging from about 0.5 to about 4.5 wt. % of the composition.

40. A composition according to claim 18 wherein said non-colloidal size magnetic particles, said colloidal-size magnetic particles, said colloidal-size polishing particles, said at least one stabilizer and said viscosity additive have weight percent contents in said composition ranging from about 21 to about 38.5 wt. %, from about 3 to about 7.5 wt. %, from about 1 to about 10 wt. %, from about 0.5 wt. % to about 10 wt. % and from 0.1 to about 5 wt. %, respectively.

41. A composition according to claim 18 wherein said non-colloidal size magnetic particles, sad colloidal-size magnetic particles, said colloidal-size polishing particles, said at least one stabilizer and said viscosity additive have weight percent contents in said composition from about 25 to about 28 wt. %, from about 3.75 to about 5.25 wt. %, from about 3 to about 5 wt. %, from about 0.5 to about 5 wt. % and from about 1 to about 5 wt. %, respectively.

42. A method for producing a composition according to claim 18, said method comprising the steps of:
preparing a dispersion of non-colloidal size magnetic particles by adding said particles to a mixture of a viscosity additive in a carrying fluid;
preparing a dispersion of colloidal-size magnetic particles with a stabilizer in a carrying fluid;
preparing a dispersion of colloidal-size polishing particles in a carrying fluid;
mixing sad colloidal-size magnetic particle dispersion and said colloidal-size polishing particle dispersion to form an intermediate mixture; and mixing said intermediate mixture with said non-colloidal size magnetic particle dispersion.

43. A method for producing a composition according to claim 42, further comprising adjusting the pH of said composition to a pH greater than 9 to about 12.

44. A method according to claim 42 further comprising the step of mixing a viscosity additive in a carrying fluid prior to the first preparing step.

45. A method according to claim 42 futher comprising the step of mixing a stabilizer in a carrying fluid prior to the preparing steps.

46. A method according to claim 42 wherein the first mixing step comprises mixing said non-colloidal magnetic particle dispersion with said colloidal polishing particle dispersion to form an intermediate mixture and the second mixing step comprises mixing said intermediate mixture with said colloidal magnetic particle dispersion.

47. A method according to claim 43 further comprising the step of adding to the polishing particle dispersion additives to enhance the rate and quality of polishing, said adding step being effected prior to the first mixing step.

48. A magnetic polishing fluid composition comprising:
    non-colloidal magnetic particles, wherein said magnetic particles have a mean particle size range from about 0.15 $\mu$m to about 3.0 $\mu$m;
    colloidal size polishing particles, said polishing particles have a mean particle size range from about 0.01 $\mu$m to about 0.1 $\mu$m;
    at least one stabilizer for stabilizing said colloidal particles;
    an additive for adjusting viscosity; and
    a carrying fluid;
    wherein the pH of said composition is greater than 9 to about 12.

49. A composition according to claim 48 wherein said non-colloidal magnetic particles have a mean particle size range from about 0.5 $\mu$m to about 1.0 $\mu$m.

50. A composition according to claim 48 wherein said non-colloidal magnetic particles are selected from a group of materials consisting of ferromagnetic metals, their alloys, ferrites, carbonyl iron, cobalt oxides, chromium oxides and iron oxides.

51. A composition according to claim 48 wherein said non-colloidal magnetic particles are selected from a group consisting of $Fe_3O_4$ and carbonyl iron particles.

52. A composition according to claim 48 wherein said colloidal-size polishing particles have a mean particle size range from about 0.03 $\mu$m to about 0.05 $\mu$m.

53. A composition according to claim 48 wherein said colloidal-size polishing particles are selected from a group consisting of $\alpha$-$Fe_2O_3$, $ThO_2$, $ZrO_2$, $SnO_2$, $SiO_2$, $ZnO$, polycrystalline diamond, SiC, and $Si_3N_4$.

54. A composition according to claim 48 wherein said colloidal-size polishing particles are $SiO_2$ particles.

55. A composition according to claim 48 wherein said carrying fluid is water.

56. A composition according to claim 48 wherein said composition has a pH greater than 9 to about 12.

57. A composition according to claim 48 wherein said viscosity additive is a polar polymeric material.

58. A composition according to claim 57 wherein said viscosity additive is a polyalcohol.

59. A composition according to claim 58 wherein said viscosity additive is polyethylene glycol.

60. A composition according to claim 48 wherein said stabilizer is chosen from a group consisting of anionic, cationic and non-ionic surfactants.

61. A composition according to claim 48 wherein said stabilizer is an alkylated ammonium hydroxide.

62. A composition according to claim 61 wherein said stabilizer is tetramethylammonium hydroxide.

63. A composition according to claim 48 further comprising additives for the enhancement of the rate and quality of the polishing process wherein said additives are selected from the group consisting of zirconium sulfate, zinc salts, ammonium molybdate, and cerium hydroxide.

64. A composition according to claim 48, wherein:
    said non-colloidal magnetic particles comprise carbonyl iron particles, said particles having a weight percent content in said composition from about 20 to about 55 wt. %;
    said colloidal-size polishing particles comprise colloidal-size silica particles, said particles having a weight percent content in said composition from about 1 to about 20 wt. %;
    said at least one stabilizer comprises tetramethylammonium hydroxide, said hydroxide having a weight percent content in said composition ranging from about 0.5 to about 25 wt. %;
    said additive for adjusting viscosity comprises polyethylene glycol, said glycol having a weight percent content in said composition ranging from about 0.1 to about 10 wt. %; and
    said carrying fluid, adjusted to a pH greater than 9 to about 12, comprising any remaining wt. % of said composition.

65. A composition according to claim 48 wherein said non-colloidal magnetic particles, said colloidal-size polishing particles, said at least one stabilizer and said viscosity additive have weight percent contents in said composition ranging from about 20 to about 55 wt. %, from about 1 to about 20 wt. %, from about 0.5 wt % to about 25 wt % and from about 0.1 wt % to about 10 wt. %, respectively.

66. A composition according to claim 48 wherein said non-colloidal magnetic particles, said colloidal-size polishing particles, said at least one stabilizer and said viscosity additive have weight percent contents in said composition ranging from about 25 to about 35 wt %, from about 3 to about 5 wt. %, from about 1 wt. % to about 8 wt % and from about 1 wt % to about 5 wt %, respectively.

67. A method for producing a composition according to claim 48, said method comprising the steps of:
    preparing a dispersion of non-colloidal magnetic particles by adding said particles to a viscosity additive in a carrying fluid;
    preparing a colloidal-size polishing particle dispersion with a stabilizer in a carrying fluid; and
    mixing said dispersion of non-colloidal magnetic particles and said dispersion of colloidal-size polishing particles.

68. A method for producing a composition according to claim 67, further comprising adjusting the pH of the mixture to a pH greater than 9 to about 12.

69. A method according to claim 67 further comprising the step of mixing a viscosity additive in a carrying fluid prior to the first preparing step.

70. A method according to claim 67 further comprising the step of mixing a stabilizer in a carrying fluid prior to the second preparing step.

* * * * *